(12) United States Patent
Vuillermet et al.

(10) Patent No.: US 11,099,217 B2
(45) Date of Patent: Aug. 24, 2021

(54) CURRENT SENSOR HAVING A FLUX CONCENTRATOR FOR REDIRECTING A MAGNETIC FIELD THROUGH TWO MAGNETIC FIELD SENSING ELEMENTS

(71) Applicant: Allegro MicroSystems, LLC, Manchester, NH (US)

(72) Inventors: Yannick Vuillermet, Voglans (FR); Cédric Gillet, Annecy (FR); Loïc André Messier, Vanzy (FR); Xavier Blanc, Annecy (FR)

(73) Assignee: Allegro MicroSystems, LLC, Manchester, NH (US)

(*) Notice: Subject to any disclaimer, the term of this patent is extended or adjusted under 35 U.S.C. 154(b) by 100 days.

(21) Appl. No.: 16/385,111

(22) Filed: Apr. 16, 2019

(65) Prior Publication Data

US 2020/0333380 A1  Oct. 22, 2020

(51) Int. Cl.
*G01R 15/20* (2006.01)
*G01R 19/00* (2006.01)

(52) U.S. Cl.
CPC ....... *G01R 15/202* (2013.01); *G01R 19/0038* (2013.01)

(58) Field of Classification Search
CPC . G01R 19/0038; G01R 15/207; G01R 33/091
See application file for complete search history.

(56) References Cited

U.S. PATENT DOCUMENTS

| | | | |
|---|---|---|---|
| 5,942,895 A | 8/1999 | Popovic et al. | |
| 6,545,462 B2 | 4/2003 | Schott et al. | |
| 6,781,359 B2 | 8/2004 | Stauth et al. | |
| 7,772,838 B2 | 8/2010 | Bailey et al. | |
| 7,936,164 B2 | 5/2011 | Doogue et al. | |
| 8,896,295 B2 | 11/2014 | Friedrich et al. | |
| 10,114,044 B2 | 10/2018 | Geisler et al. | |
| 2004/0008022 A1* | 1/2004 | Viola | G01R 15/202 |
| | | | 324/117 R |
| 2007/0080676 A1 | 4/2007 | Racz et al. | |

(Continued)

OTHER PUBLICATIONS

European Extended Search Report dated Sep. 25, 2020 for European Application No. 20166819.1; 7 pages.

(Continued)

*Primary Examiner* — Alvaro E Fortich

(74) *Attorney, Agent, or Firm* — Daly, Crowley, Mofford & Durkee, LLP

(57) ABSTRACT

A method can use a current sensor that can include a magnetic flux concentrator along with first and second magnetic field sensing elements disposed proximate to the magnetic flux concentrator, wherein the magnetic flux concentrator is operable to influence a direction of first and second magnetic fields at the first and second magnetic field sensing elements, respectively, the first and second magnetic fields resulting from an electrical current passing through a conductor, the first and second magnetic field sensing elements operable to generate first and second signals, respectively, in response to the first and second magnetic fields, respectively, wherein the current sensor can also include a differencing circuit operable to subtract the first and second signals to generate a difference signal related to the electrical current.

54 Claims, 10 Drawing Sheets

(56) References Cited

U.S. PATENT DOCUMENTS

2013/0015839 A1* 1/2013 Franke ............... G01R 33/0011
                                                              324/117 H
2017/0108559 A1* 4/2017 Yuan .................... G01R 33/098
2018/0059148 A1* 3/2018 Geisler ................. G01R 15/20
2018/0245994 A1* 8/2018 May ........................ G01L 3/105
2018/0306843 A1  10/2018 Bussing et al.

OTHER PUBLICATIONS

MLX91208 IMC-Hall® Current Sensor (Triaxis® Technology), Melixis Inspired Engineering, 3901091208 Rev. 007, Jun. 2018; 20 pages.

Allegro MicroSystems, LLC A1367 Datasheet, Low-Noise, High-Precision, Programmable Lindear Hall-Effect Sensor IC with Regulated Supply, Advanced Temperature Compensation, and High-Bandwidth (240 kHz) Analog Output A1367-DS, Rev. 2, dated Aug. 19, 2016; 27 pages.

Response to Official Communication filed on Mar. 30, 2021 for European Application No. 20166819.1; 17 pages.

* cited by examiner

CURRENT SENSOR HAVING A FLUX CONCENTRATOR FOR REDIRECTING A MAGNETIC FIELD THROUGH TWO MAGNETIC FIELD SENSING ELEMENTS

CROSS REFERENCE TO RELATED APPLICATIONS

Not Applicable.

STATEMENT REGARDING FEDERALLY SPONSORED RESEARCH

Not Applicable.

FIELD OF THE INVENTION

This invention relates generally to current sensors and, more particularly, to a current sensor that has a magnetic flux concentrator for redirecting a magnetic field through two magnetic field sensing elements, e.g., two planar Hall elements.

BACKGROUND

A magnetic field sensor can be used to sense a magnetic field generated by an electrical current flowing through a conductor. These magnetic field sensors can be referred to as current sensors.

Referring to FIG. 1, a typical current sensor assembly 100 has a ring shaped magnetic flux concentrator 104 disposed around a conductor 102 of electrical current. As is known, a current, represented by an arrow 106, flowing through the conductor 102 has a magnetic field circular around the conductor, with a magnetic direction determined by a direction of the electrical current. The magnetic flux concentrator 104 can cause an increase (a concentration) of the magnetic field proximate to and within the magnetic flux concentrator 104. The magnetic flux concentrator 104 can also result in some amount of desirable reduction in sensitivity to stray external magnetic fields.

The magnetic flux concentrator 104 can include a gap in a region 110, in which a magnetic field sensor 108 (i.e., a current sensor) can be disposed. In operation, in response to the current flowing through the conductor 102, which generates a concentrated magnetic field in the magnetic flux concentrator 104, the increased magnetic field essentially passes though the gap within the region 110, also with an increased magnetic field. The current sensor 108 can be responsive to magnetic fields in the z-direction in x-y-z Cartesian coordinates.

The circular magnetic flux concentrator 104 can be relatively large and relatively expensive.

Without having the circular magnetic flux concentrator, the current sensor 108 would generate insufficient sensitivity to the sensed current, would provide insufficient signal to noise ratio, and would provide an insufficient decrease of sensitivity to stray external magnetic fields.

It would also be desirable to provide a current sensor that does not use a circular magnetic flux concentrator but that can generate a sufficient sensitivity, can provide sufficient signal to noise ratio, and can provide a sufficient decrease of sensitivity to stray external magnetic fields.

SUMMARY

The present invention provides a current sensor that does not use a circular magnetic flux concentrator but that can generate a sufficient sensitivity, can provide sufficient signal to noise ratio, and can provide a sufficient decrease of sensitivity to stray external magnetic fields.

In accordance with an example useful for understanding an aspect of the present invention, a current sensor can include a magnetic flux concentrator and a first magnetic field sensing element disposed proximate to the magnetic flux concentrator, the first magnetic field sensing element having a first maximum response axis, the first magnetic field sensing element operable to generate a first signal responsive to a first magnetic field proximate to the first magnetic field sensing element resulting from an electrical current passing through a conductor, wherein the magnetic flux concentrator is operable to influence a direction of the first magnetic field. The current sensor also includes a second magnetic field sensing element disposed proximate to the magnetic flux concentrator, the second magnetic field sensing element having a second maximum response axis, the second magnetic field sensing element operable to generate a second signal responsive to a second magnetic field proximate to the second magnetic field sensing element resulting from the electrical current passing through the conductor, wherein the magnetic flux concentrator is operable to influence a direction of the second magnetic field. The current sensor can also include a differencing circuit operable to subtract the first and second signals to generate a difference signal related to the electrical current.

In accordance with another example useful for understanding another aspect of the present invention, a method of measuring an electrical current can include providing a first magnetic field sensing element disposed proximate to a magnetic flux concentrator, the first magnetic field sensing element having a first maximum response axis. The method also includes providing a second magnetic field sensing element disposed proximate to the magnetic flux concentrator, the second magnetic field sensing element having a second maximum response axis. The method can also include using the first magnetic field sensing element to generate a first signal responsive to a first magnetic field proximate resulting from the electrical current passing through a conductor, wherein the magnetic flux concentrator is operable to influence a direction of the first magnetic field. The method can also include using the second magnetic field sensing element to generate a second signal responsive to a second magnetic field resulting from the electrical current passing through the conductor, wherein the magnetic flux concentrator is operable to influence a direction of the second magnetic field. The method can also include, with a differencing circuit, subtracting the first and second signals to generate a difference signal related to the electrical current.

BRIEF DESCRIPTION OF THE DRAWINGS

The foregoing features of the invention, as well as the invention itself may be more fully understood from the following detailed description of the drawings, in which.

DETAILED DESCRIPTION

Figure 1:
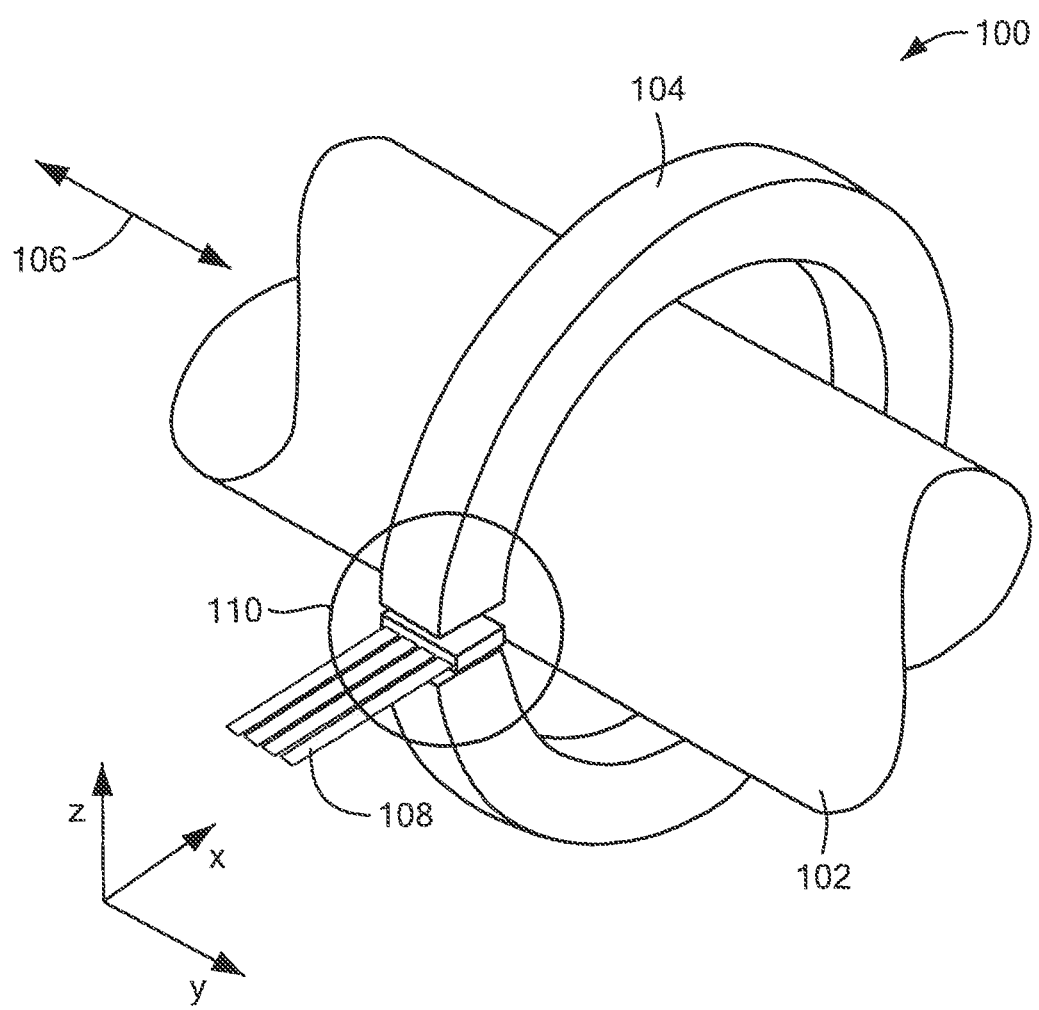
FIG. 1 is a pictorial showing a conventional current sensor arrangement having a circular magnetic flux concentrator.

As used herein, the term "magnetic field sensing element" is used to describe a variety of electronic elements that can sense a magnetic field. The magnetic field sensing element can be, but is not limited to, a Hall effect element, a magnetoresistance element, or a magnetotransistor. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensor" is used to describe an assembly that uses a magnetic field sensing element in combination with an electronic circuit, all disposed upon a common substrate, e.g., a semiconductor substrate. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

The terms "parallel" and "perpendicular" are used in various contexts herein. It should be understood that the terms parallel and perpendicular do not require exact perpendicularity or exact parallelism, but instead it is intended that normal manufacturing tolerances apply, which tolerances depend upon the context in which the terms are used. In some instances, the term "substantially" is used to modify the terms "parallel" or "perpendicular." In general, use of the term "substantially" reflects angles that are beyond manufacturing tolerances, for example, within +/−ten degrees.

While electronic circuits shown in figures herein may be shown in the form of analog blocks or digital blocks, it will be understood that the analog blocks can be replaced by digital blocks that perform the same or similar functions and the digital blocks can be replaced by analog blocks that perform the same or similar functions. Analog-to-digital or digital-to-analog conversions may not be explicitly shown in the figures, but should be understood.

As used herein, the term "amplifier" is used to describe a circuit element with a gain greater than one, less than one, or equal to one.

As used herein, the terms "line" and "linear" are used to describe either a straight line or a curved line. The line can be described by a function having any order less than infinite.

Many examples shown and described herein use planar Hall elements. Magnetic flux concentrators shown and described herein can redirect magnetic fields to pass through the planar Hall elements in a direction to which they are sensitive, i.e., such that a component of the direction is perpendicular to a substrate on which the planar Hall elements are formed. However, as described in conjunction with FIG. 15, in other embodiments, other types of magnetic field sensing elements can be used, for example, vertical Hall elements or magnetoresistance elements, which can be disposed upon substrates oriented ninety degrees from those shown, such that they are responsive to the redirected magnetic fields.

Figure 2:
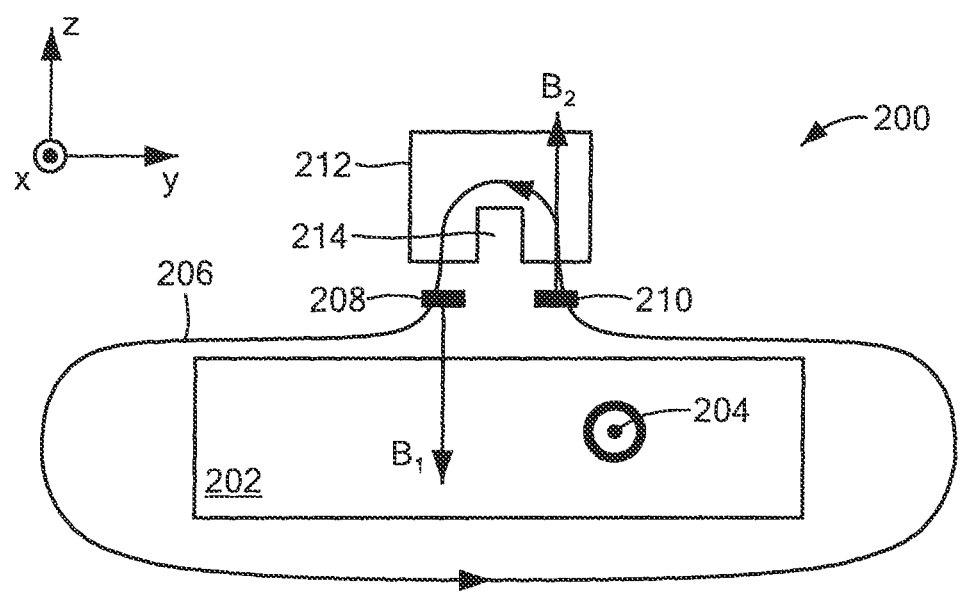
FIG. 2 is a block diagram showing a side view of a current sensor arrangement with two planar Hall elements and a magnetic flux concentrator, all disposed proximate to a bus bar conductor operable to pass an electrical current.

Referring to FIG. 2, an example of a current sensor arrangement 200 can include first and second planar Hall elements 208, 210, respectively, disposed proximate to a bus bar (rectangular) conductor 202, here shown to be a bus bar (rectangular) conductor 202, can be operable to conduct an electrical current 204, here coming out of the page.

A magnetic flux concentrator 212 disposed proximate to the conductor 202 has a channel 214 parallel to an x-axis and oriented toward the conductor 202. The first and second planar Hall elements 208, 210 can be disposed between the conductor 202 and the magnetic flux concentrator 212.

A flux line 206 can be one of many flux lines, for which each respective flux line is indicative of a particular respective magnitude of magnetic field. Thus, each flux line is essentially an isoline having the same magnetic field. Arrows along the flux line 206 can be indicative of a direction of the magnetic field.

For a direction of the current 204 coming out of the page, the magnetic flux line 206 has a magnetic direction generally counterclockwise. If the current 204 flowed in the opposite direction, then the magnetic flux line 206 would have a magnetic direction generally clockwise.

In operation, the magnetic flux concentrator 212 tends to redirect the flux line upward and then downward into and out of the magnetic flux concentrator 212. With this redirection, the flux line 206 passes through the first and second planar Hall elements 208, 210 with direction components substantially parallel to a z direction to which the first and second planar Hall elements 208, 210 are responsive, but with opposite directions. Thus, the first and second planar Hall elements 208, 210 have opposite responses to the flux line 206, and therefore, opposite responses to the current 204. The redirection and resulting opposite responses by the first and second planar Hall elements 208, 210 can be used advantageously in the electronic circuit 300 of FIG. 3.

Figure 3:
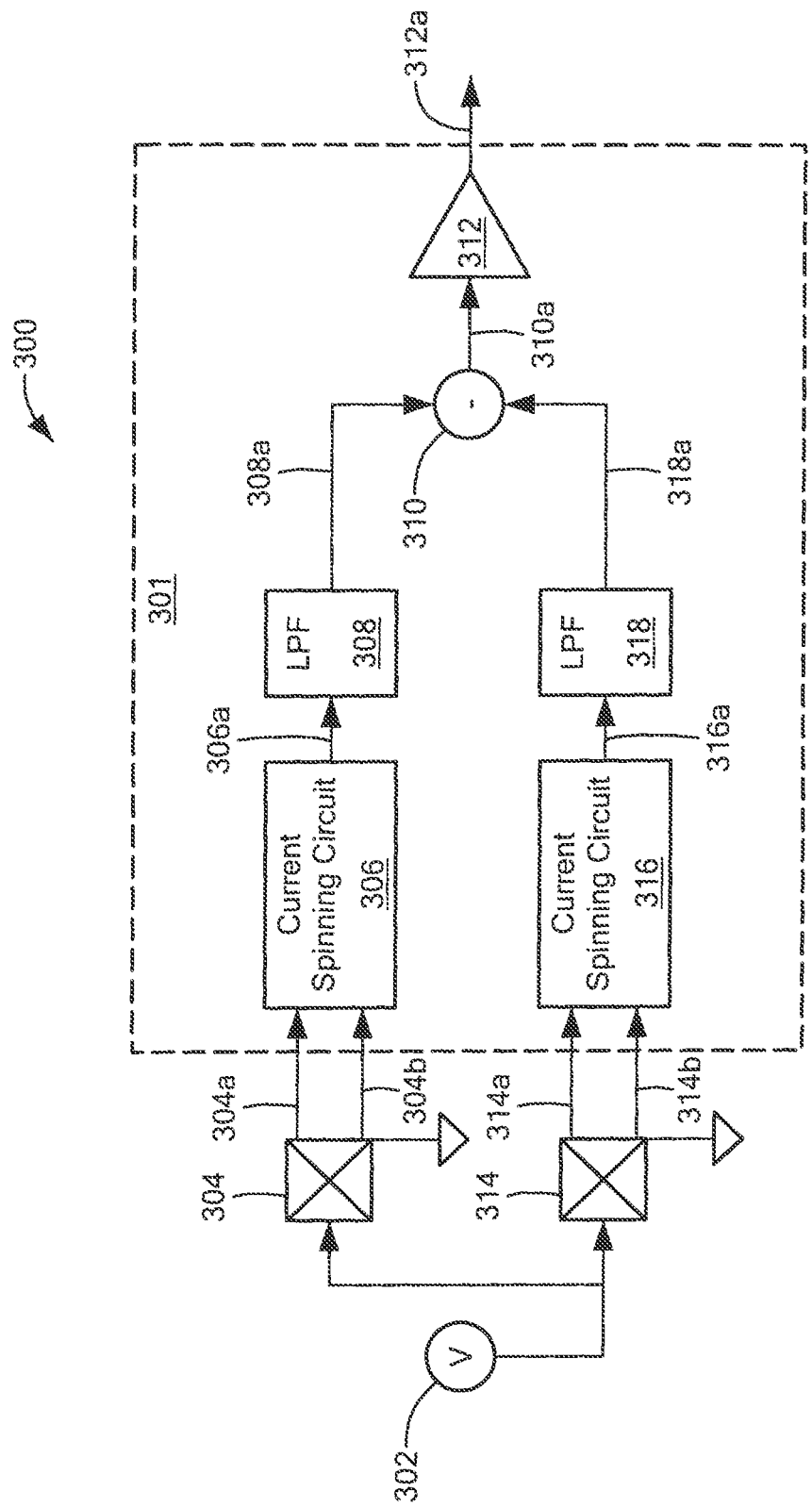
FIG. 3 is a block diagram of a portion of an integrated current sensor having two planar Hall elements coupled to an electronic circuit resulting in a differential arrangement, which can be used as a portion of a current sensor according to the current sensor arrangements of FIGS. 2 and 4-14 herein.

Referring now to FIG. 3, a portion 300 of a current sensor can include first and second planar Hall elements 304, 314 coupled to an electronic circuit 301. The first and second planar Hall elements 304, 314 can be coupled between a voltage source 302 and a ground.

The first planar Hall element 304 can generate a first differential signal 304a, 304b and the second planar Hall element can generate a second differential signal 314a, 314b.

For discussion above, it should be understood that, when arranged as in FIG. 2, the first differential signal 304a, 304b and the second differential signal 314a, 314b can be opposite signals, e.g., signals with opposite voltages.

As is known, a typical planar Hall element is a four terminal device, often square in shape from a top view, and thus, having four corners. A voltage and ground are applied to a pair of diagonally opposing terminals, respectively, and a differential voltage is generated across the other pair of diagonally opposing terminals.

In some arrangements, and in order to reduce a DC offset voltage (voltage indicative of a magnetic field when no magnetic field is present), the pair of terminals selected for coupling to the voltage and ground, and the pair of terminals selected for the differential signal from the Hall element changes from time to time, generally at a high rate of change. There are four such coupling arrangements for a planar Hall element. When operating, the coupling arrangements can be referred to as current spinning.

Accordingly, the electronic circuit 301 can include a first current spinning circuit 306 coupled to receive the first differential signal 304a, 304b, which can come from first selected pairs of terminals of the first planar Hall element. Not shown, the first current spinning circuit 306 can also control to which second pairs of terminals of the first planar Hall element 304 the voltage 302 and ground are coupled in synchronous relationship with the first pairs of terminals.

The first current spinning circuit 306 can generate a first spinning signal 306a. With the current spinning arrangement, the first spinning signal can have two or more spectral parts, for which a desired baseband part can be indicative of a magnetic field sensed by the first planar Hall element 304 and a second higher frequency part can be indicative of the DC offset voltage.

The spinning signal 306a can be coupled to a low pass filter operable to generate a first filtered signal 308a that can include only the desired baseband part.

Elements 316 and 318 can operate in the same way as elements 306, 308, and can result in a second filtered signal 318a.

A differencing circuit 310 can be coupled to the first and second filtered signals 308a, 318a, respectively, and can be operable to generate a difference signal 310a.

An amplifier 312 can be coupled to the difference signal 310a and can be operable to generate an amplified difference signal 312a.

It should be appreciated that, because the magnetic fields pass through the first and second planer Hall elements, 208, 210 of FIG. 2 in opposite direction, and therefore generate opposite signals, the differencing circuit 310 operates to combine the first and second filtered signals 308a, 318a constructively.

It should also be appreciated that a stray magnetic field generated outside of the current sensor arrangement 200 can received by the first and second planar Hall elements 208, 210 in the same direction, and therefore generate same stray field related signals with the same phase or sign. Same stray field related signals generated by the first and second planar Hall element 208, 210 result in a cancellation of the same stray field related signals by the differencing circuit 310.

In other embodiments, current spinning is not used and the current spinning circuits 306, 316 and perhaps the low pass filters 308, 318, can be omitted.

The first and second planar Hall elements 304, 314 and the electronic circuit 301 can be used in the current sensor arrangements of FIGS. 2 and 4-14 herein.

Figure 4:
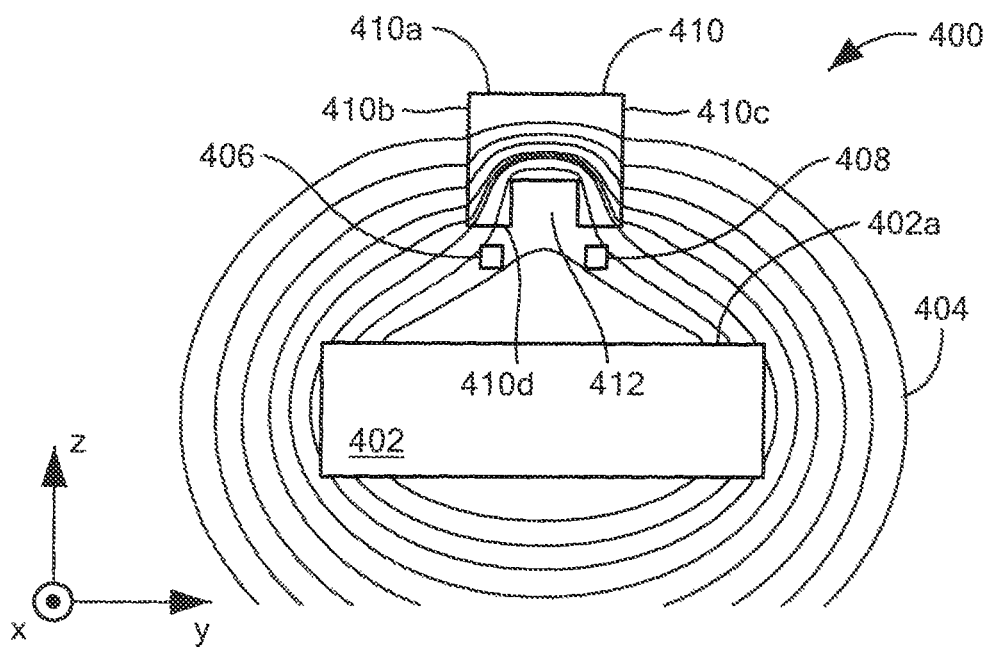
FIG. 4 is a block diagram showing a side view of another current sensor arrangement with two planar Hall elements and a magnetic flux concentrator, all disposed proximate to a bus bar conductor operable to pass an electrical current.

Referring now to FIG. 4, another illustrative current sensor arrangement 400 can be like the current sensor arrangement of FIG. 2. A conductor 402 can carry an electrical current (into and/or out of the page), resulting in flux lines 404. A magnetic flux concentrator 410 can be disposed substantially symmetrically with the conductor 402. Essentially, the magnetic flux concentrator 410 has a central plane (parallel to the x-z plane) bisecting the magnetic flux concentrator 410, wherein the magnetic flux concentrator 410 is symmetrical around the central plane, and wherein the first and second planar Hall elements 406, 408 are disposed symmetrically on opposite sides of the central plane.

The magnetic flux concentrator 410 can have a relative magnetic permeability of greater than about two. The relative magnetic permeability μr is defined as such: $\mu r = \mu/\mu_0$. Where μ is the magnetic permeability of the magnetic flux concentrator and $\mu_0$ is the magnetic permeability of free space.

The first and second planar Hall elements 406, 408 have maximum response axes substantially parallel to a z-axis.

The magnetic flux concentrator 410 and the first and second planar Hall elements 406, 408 are disposed proximate to a face 402a, e.g., a largest face, of the conductor 402, which is parallel to an x-y plane.

As shown, and similar to that shown in FIG. 2, flux lines 404 at positions of the first and second planar Hall elements 406, 408 are redirected by the magnetic flux concentrator 410 to have directions that are parallel to, or that have direction components parallel to, the z-axis. As understood from FIG. 2 above, the direction components parallel to the z-axis are opposite in direction at the two planar Hall elements. 406, 408.

The magnetic flux concentrator 410 has two faces 410b, 410c parallel to the x-z plane that are rectangular, and a face 410a parallel to the x-y plane that is rectangular. However, the magnetic flux concentrator 410 has a side 410d parallel to the x-y plane that has a rectangular channel 412 running parallel to an x-direction.

The current sensor arrangement 400 provides a differential current sensor for which sensitivity is increased and an influence of external stray magnetic fields is reduced, when compared to a single magnetic field sensing element current sensor arrangement, e.g., the current sensor arrangement 100 of FIG. 1.

Figure 5:
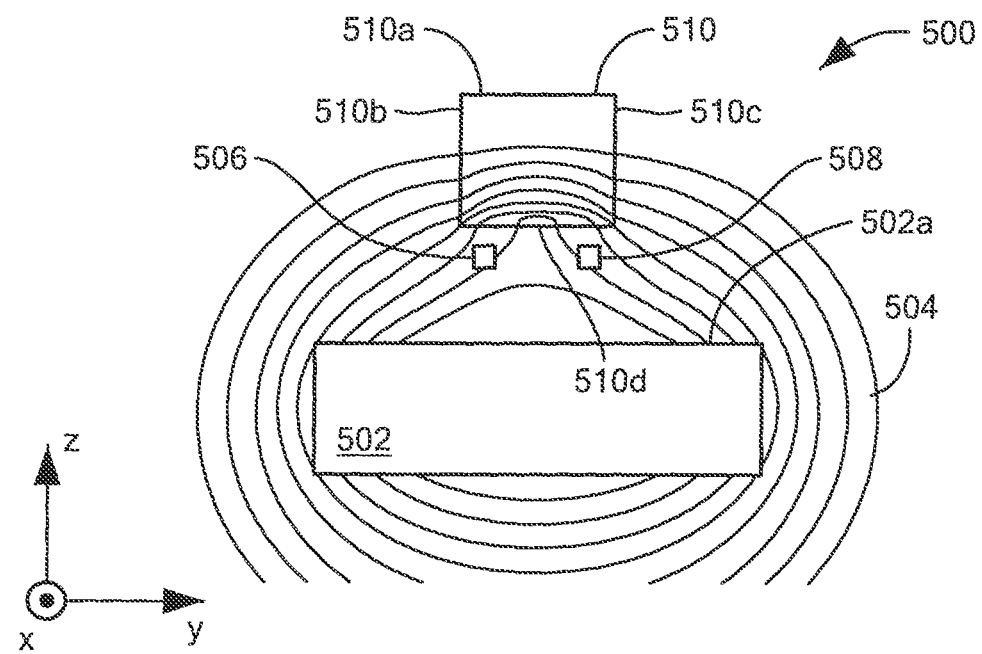
FIG. 5 is a block diagram showing a side view of another current sensor arrangement with two planar Hall elements and a magnetic flux concentrator, all disposed proximate to a bus bar conductor operable to pass an electrical current.

Referring now to FIG. 5, another illustrative current sensor arrangement 500 can be like the current sensor arrangement of FIG. 2. A conductor 502 can carry an electrical current (into and/or out of the page), resulting in flux lines 504. A magnetic flux concentrator 510 can be disposed symmetrically with the conductor 502. Essentially, the magnetic flux concentrator 510 has a central plane (parallel to the x-z plane) bisecting the magnetic flux concentrator 510, wherein the magnetic flux concentrator 510 is symmetrical around the central plane, and wherein the first and second planar Hall elements 506, 508 are disposed symmetrically on opposite sides of the central plane.

The magnetic flux concentrator 450 can have a relative magnetic permeability of greater than about two.

The first and second planar Hall elements 506, 508 have maximum response axes substantially parallel to a z-axis.

The magnetic flux concentrator 510 and the first and second planar Hall elements 506, 508 are disposed proximate to a largest face 502a of the conductor 502, which is parallel to an x-y plane.

As shown, and similar to that shown in FIG. 2, flux lines 504 at positions of the first and second planar Hall elements 506, 508 are redirected by the magnetic flux concentrator 510 to have directions that are parallel to, or that have direction components parallel to, the z-axis. As understood from FIG. 2 above, the direction components parallel to the z-axis are opposite in direction but have substantially the same amplitude.

The magnetic flux concentrator 510 has two faces 510b, 510c parallel to the x-z plane that are rectangular, and a face 510a parallel to the x-y plane that is rectangular. A side 510d parallel to the x-y plane is also rectangular. Thus, the magnetic flux concentrator 510 is a rectangular solid.

The current sensor arrangement 500 provides a differential current sensor for which sensitivity is increased and an influence of external stray magnetic fields is reduced, when compared to a single magnetic field sensing element current sensor arrangement.

Figure 6:
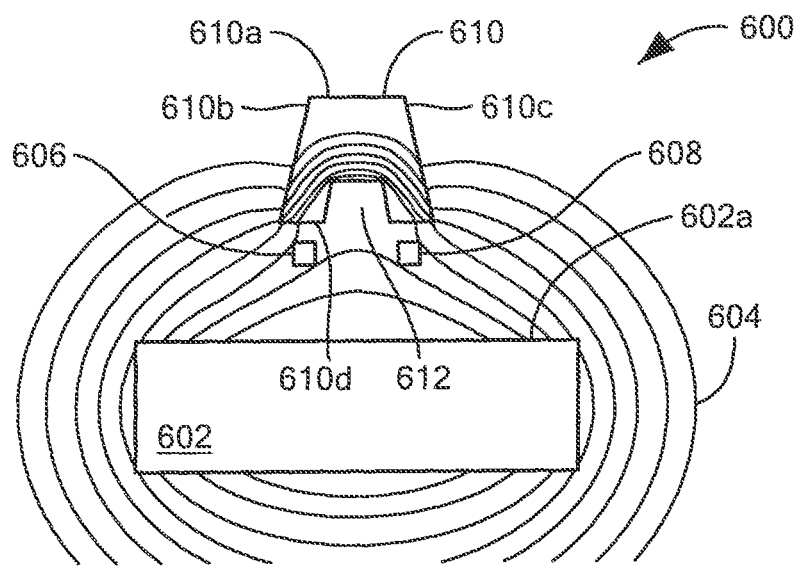
FIG. 6 is a block diagram showing a side view of another current sensor arrangement with two planar Hall elements and a magnetic flux concentrator, all disposed proximate to a bus bar conductor operable to pass an electrical current.

Referring now to FIG. 6, another illustrative current sensor arrangement 600 can be like the current sensor arrangement of FIG. 2. A conductor 602 can carry an electrical current (into and/or out of the page), resulting in flux lines 604. A magnetic flux concentrator 610 can be disposed symmetrically with the conductor 602. Essentially, the magnetic flux concentrator 610 has a central plane (parallel to the x-z plane) bisecting the magnetic flux concentrator 610, wherein the magnetic flux concentrator 610 is symmetrical around the central plane, and wherein the first and second planar Hall elements 606, 608 are disposed symmetrically on opposite sides of the central plane.

The magnetic flux concentrator 610 can have a relative magnetic permeability of greater than about two.

The first and second planar Hall elements 606, 608 have maximum response axes substantially parallel to a z-axis.

The magnetic flux concentrator 610 and the first and second planar Hall elements 606, 608 are disposed proximate to a largest face 602a of the conductor 602, which is parallel to an x-y plane.

As shown, and similar to that shown in FIG. 2, flux lines 606 at positions of the first and second planar Hall elements 606, 608 are redirected by the magnetic flux concentrator 610 to have directions that are parallel to, or that have direction components parallel to, the z-axis. As understood from FIG. 2 above, the direction components parallel to the z-axis are opposite in direction but have substantially the same amplitude.

The magnetic flux concentrator 610 has two faces 610b, 610c not parallel to the x-z plane, but that are rectangular, and a face 610a parallel to the x-y plane that is rectangular. Thus, the magnetic flux concentrator 610 has a trapezoidal shape. The magnetic flux concentrator 610 has a side 610d parallel to the x-y plane that has a trapezoidal channel 612 running parallel to an x-direction.

The current sensor arrangement 600 provides a differential current sensor for which sensitivity is increased and an influence of external stray magnetic fields is reduced, when compared to a single magnetic field sensing element current sensor arrangement.

Figure 7:
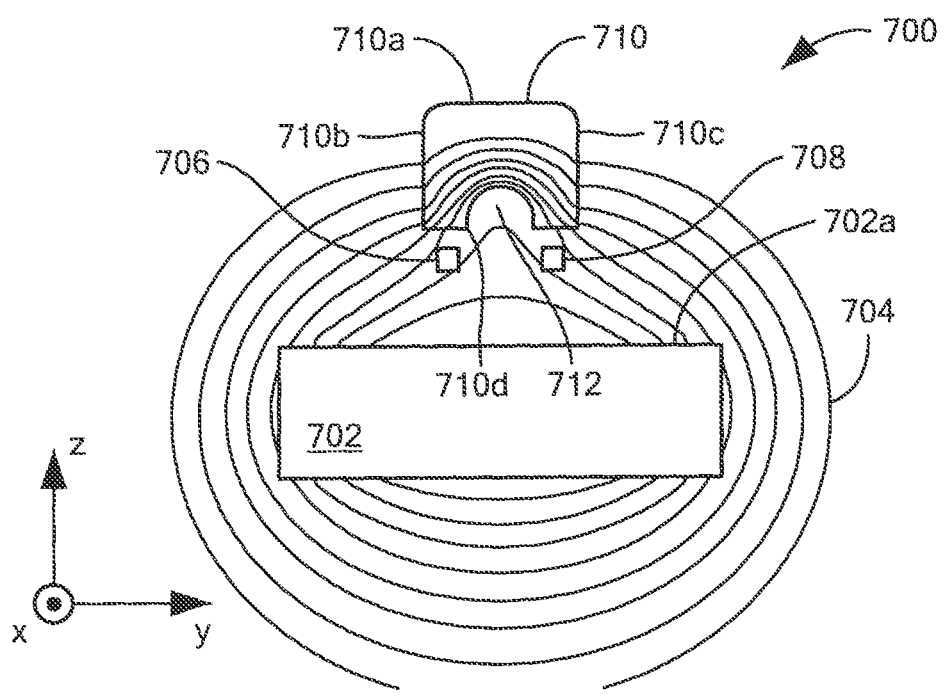
FIG. 7 is a block diagram showing a side view of another current sensor arrangement with two planar Hall elements and a magnetic flux concentrator, all disposed proximate to a bus bar conductor operable to pass an electrical current.

Referring now to FIG. 7, another illustrative current sensor arrangement 700 can be like the current sensor arrangement of FIG. 2. A conductor 702 can carry an electrical current (into and/or out of the page), resulting in flux lines 704. A magnetic flux concentrator 710 can be disposed symmetrically with the conductor 702. Essentially, the magnetic flux concentrator 710 has a central plane (parallel to the x-z plane) bisecting the magnetic flux concentrator 710, wherein the magnetic flux concentrator 710 is symmetrical around the central plane, and wherein the first and second planar Hall elements 706, 708 are disposed symmetrically on opposite sides of the central plane.

The magnetic flux concentrator 710 can have a relative magnetic permeability of greater than about two.

The first and second planar Hall elements 706, 708 have maximum response axes substantially parallel to a z-axis.

The magnetic flux concentrator 710 and the first and second planar Hall elements 706, 708 are disposed proximate to a largest face 702a of the conductor 702, which is parallel to an x-y plane.

As shown, and similar to that shown in FIG. 2, flux lines 704 at positions of the first and second planar Hall elements 706, 708 are redirected by the magnetic flux concentrator 710 to have directions that are parallel to, or that have direction components parallel to, the z-axis. As understood from FIG. 2 above, the direction components parallel to the z-axis are opposite in direction but have substantially the same amplitude.

The magnetic flux concentrator 710 has two faces 710b, 710c parallel to the x-z plane that are rectangular, and a face 710a parallel to the x-y plane that is rectangular. The faces 710b, 710c intersect the face 710a with curved regions. The magnetic flux concentrator 710 has a side 710d parallel to the x-y plane that has a semi-circular channel 712 running parallel to an x-direction.

The current sensor arrangement 700 provides a differential current sensor for which sensitivity is increased and an influence of external stray magnetic fields is reduced, when compared to a single magnetic field sensing element current sensor arrangement.

Figure 8:
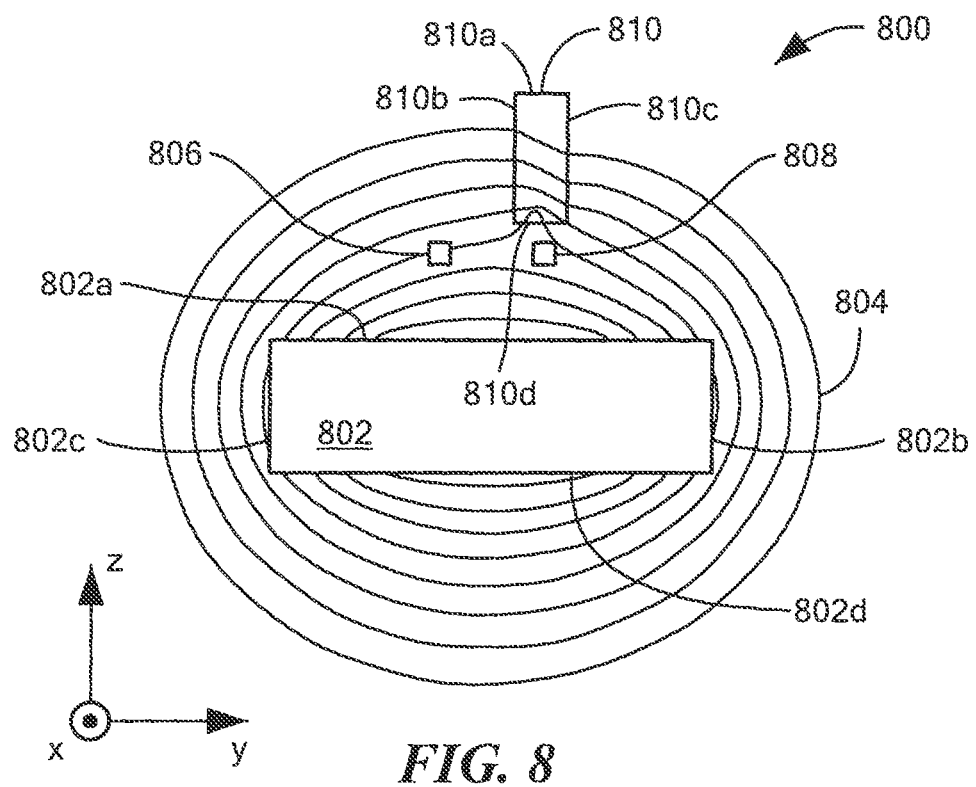
FIG. 8 is a block diagram showing a side view of another current sensor arrangement with two planar Hall elements and a magnetic flux concentrator, all disposed proximate to a bus bar conductor operable to pass an electrical current.

Referring now to FIG. 8, another illustrative current sensor arrangement 800 can be like the current sensor arrangement of FIG. 2. A conductor 802 can carry an electrical current (into and/or out of the page), resulting in flux lines 804. A magnetic flux concentrator 810 can be disposed asymmetrically with the conductor 802. The magnetic flux concentrator 810 has a central plane (parallel to the x-z plane) bisecting the magnetic flux concentrator 810, wherein the magnetic flux concentrator 810 is symmetrical around the central plane, and wherein the first and second planar Hall elements 806, 808 are disposed asymmetrically relative to the central plane.

The magnetic flux concentrator 810 can have a relative magnetic permeability of greater than about two.

The first and second planar Hall elements 806, 808 have maximum response axes substantially parallel to a z-axis.

The magnetic flux concentrator 810 and the first and second planar Hall elements 806, 808 are disposed proximate to a largest face 802a of the conductor 802, which is parallel to an x-y plane.

As shown, and similar to that shown in FIG. 2, flux lines 804 at positions of the first and second planar Hall elements 806, 808 are redirected by the magnetic flux concentrator 810 to have directions that have direction components parallel to the z-axis. As understood from FIG. 2 above, the direction components parallel to the z-axis are opposite in direction, and here do not have the same amplitude or angle at the planar Hall elements 806, 808.

The magnetic flux concentrator 810 has two faces 810b, 810c parallel to the x-z plane that are rectangular, and a face 810a parallel to the x-y plane that is rectangular. A side 810d parallel to the x-y plane is also rectangular. Thus, the magnetic flux concentrator 810 is a rectangular solid.

The current sensor arrangement 800 provides a differential current sensor for which sensitivity is increased and an influence of external stray magnetic fields is reduced, when compared to a single magnetic field sensing element current sensor arrangement, but not as much as for current sensor arrangements described in other figures herein.

Figure 9:
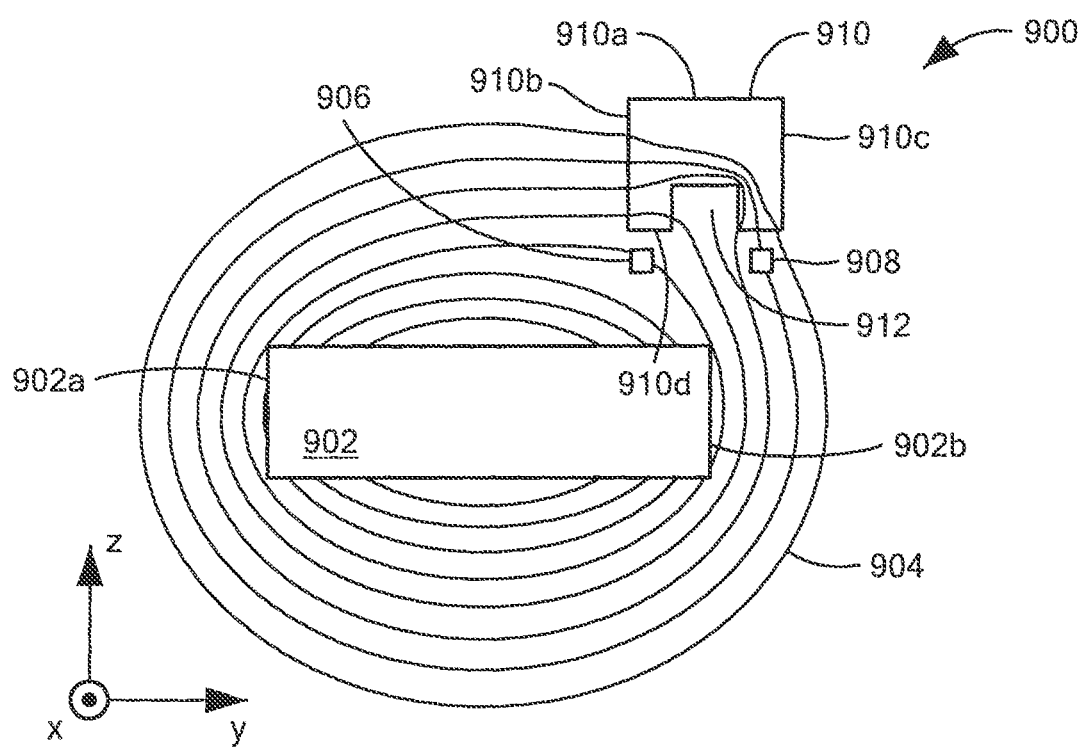
FIG. 9 is a block diagram showing a side view of another current sensor arrangement with two planar Hall elements and a magnetic flux concentrator, all disposed proximate to a bus bar conductor operable to pass an electrical current.

Referring now to FIG. 9, another illustrative current sensor arrangement 900 can be like the current sensor arrangement of FIG. 2. A conductor 902 can carry an electrical current (into and/or out of the page), resulting in flux lines 904. A magnetic flux concentrator 910 can be disposed asymmetrically with the conductor 902. Essentially, the magnetic flux concentrator 910 has a central plane (parallel to the x-z plane) bisecting the magnetic flux concentrator 910, wherein the magnetic flux concentrator 910 is symmetrical around the central plane, and wherein the first and second planar Hall elements 906, 908 are disposed symmetrically on opposite sides of the central plane.

The magnetic flux concentrator 910 can have a relative magnetic permeability of greater than about two.

The first and second planar Hall elements 906, 908 have maximum response axes substantially parallel to a z-axis.

The magnetic flux concentrator 910 and the first and second planar Hall elements 906, 908 are disposed proximate to an intersection between largest face 902a of the conductor 902, which is parallel to an x-y plane, and a smaller face of the conductor 902b.

As shown, and similar to that shown in FIG. 2, flux lines 904 at positions of the first and second planar Hall elements 906, 908 are redirected by the magnetic flux concentrator 910 to have direction components parallel to the z-axis. The direction components parallel to the z-axis are not opposite in direction, but still a differential arrangement is useful.

The magnetic flux concentrator 910 has two faces 910b, 910c parallel to the y-z plane that are rectangular, and a face 910a parallel to the x-y plane that is rectangular. However, the magnetic flux concentrator 910 has a side 910d parallel to the x-y plane that has a rectangular channel 912 running parallel to a x-direction.

The current sensor arrangement 900 provides a differential current sensor for which sensitivity is not substantially increased but an influence of external stray magnetic fields is reduced, when compared to a single magnetic field sensing element current sensor arrangement.

Figure 10:
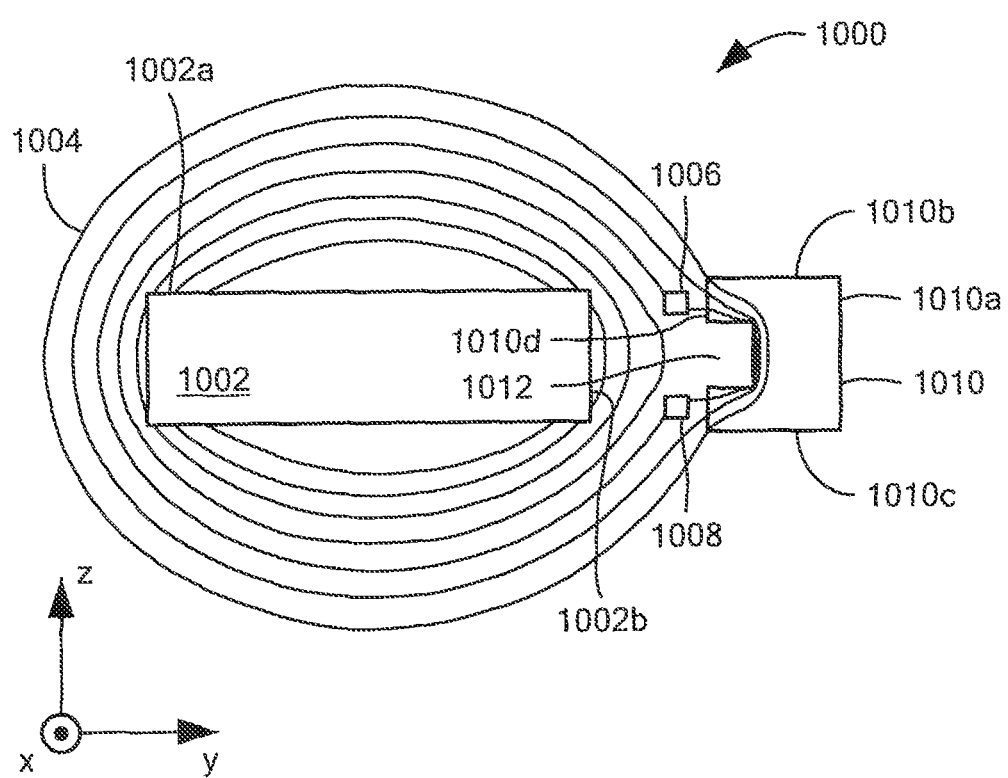
FIG. 10 is a block diagram showing a side view of another current sensor arrangement with two planar Hall elements and a magnetic flux concentrator, all disposed proximate to a bus bar conductor operable to pass an electrical current.

Referring now to FIG. 10, another illustrative current sensor arrangement 1000 can be like the current sensor arrangement of FIG. 2. A conductor 1002 can carry an electrical current (into and/or out of the page), resulting in flux lines 1004. A magnetic flux concentrator 1010 can be disposed symmetrically with the conductor 1002. The magnetic flux concentrator 1010 has a central plane (parallel to the x-y plane) bisecting the magnetic flux concentrator 1010, wherein the magnetic flux concentrator 1010 is symmetrical around the central plane, and wherein the first and second planar Hall elements 1006, 1008 are disposed symmetrically on opposite sides of the central plane.

The magnetic flux concentrator 1010 can have a relative magnetic permeability of greater than about two.

The first and second planar Hall elements 1006, 1008 have maximum response axes substantially parallel to and y-axis.

The magnetic flux concentrator 1010 and the first and second planar Hall elements 1006, 1008 are disposed proximate to an intersection proximate to a smallest face 1002b of the conductor 1002, which is parallel to a x-z plane.

As shown, and similar to that shown in FIG. 2, flux lines 1004 at positions of the first and second planar Hall elements 1006, 1008 are redirected by the magnetic flux concentrator 1010 to have direction components parallel to the y-axis. The direction components parallel to the y-axis are opposite in direction.

The magnetic flux concentrator 1010 has two faces 1010b, 1010c parallel to the x-y plane that are rectangular, and a face 1010a parallel to the x-z plane that is rectangular. However, the magnetic flux concentrator 1010 has a side 1010d parallel to the x-z plane that has a rectangular channel 1012 running parallel to a x-direction.

The current sensor arrangement 1000 provides a differential current sensor for which sensitivity is increased and an influence of external stray magnetic fields is reduced, when compared to a single magnetic field sensing element current sensor arrangement.

Unlike the current sensor arrangements described above, for which planar Hall elements are disposed over a largest surface of a conductor, here the planar Hall elements are disposed to the side of a conductor, with similar advantageous functions.

The magnetic flux concentrators described herein can be operable to influence the direction of the first magnetic field to pass through the first planar Hall element in a first direction, the magnetic flux concentrator is operable to influence the direction of the second magnetic field to pass through the second planar Hall element in a second direction different than the first direction, wherein the first and second directions differ by an angle difference in a range of one hundred eighty to one hundred forty degrees. In other embodiments, the angle difference can be in the range of two hundred to forty degrees.

As described above, magnetic flux concentrators described herein can have a relative magnetic permeability greater than about two.

Figure 11:
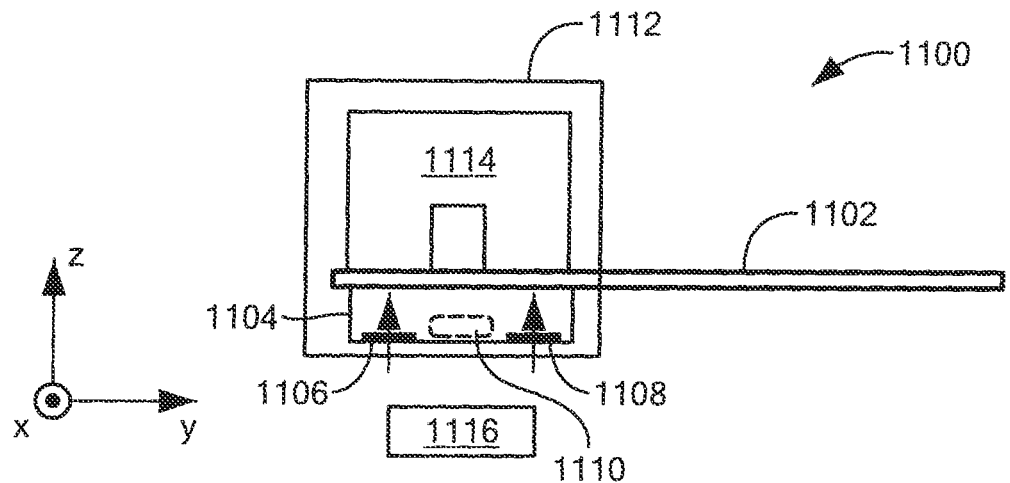
FIG. 11 is a block diagram of a current sensor having two planar Hall elements and an electronic circuit disposed on or within a substrate, the substrate disposed upon a first surface of a lead frame, and a magnetic flux concentrator disposed upon a second surface of the substrate, and an enclosure surrounding the substrate, a portion of the lead frame, and the magnetic flux concentrator.

Referring now to FIG. 11, a current sensor 1100 can include first and second planar Hall elements 1106, 1108 disposed over or within a surface of a substrate 1104, for example, a semiconductor substrate. Arrows over the planar Hall elements 1106, 1108 are representative of maximum response directions or axes.

An electronic circuit 1110 can also be disposed over or within the surface of a substrate 1104 The electronic circuit 1110 can be the same as or similar to the electronic circuit 301 of FIG. 3.

The substrate 1104 can be disposed proximate to or upon a lead frame 1102, and electrically coupled to the lead frame with bond wires or the like.

A magnetic flux concentrator 1114 can be disposed on an opposite side of the lead frame 1102. The magnetic flux concentrator 1114 can be like any of the magnetic flux concentrators described above. A mold compound 1112 can encapsulate the substrate 1104, the magnetic flux concentrator 1114, and a portion of the lead frame 1102.

The current sensor 1100 can be disposed proximate to a conductor 1116 that can carry a current that is measured by the current sensor 1100. The measured current can be in a direction into or out of the page.

Figure 12:
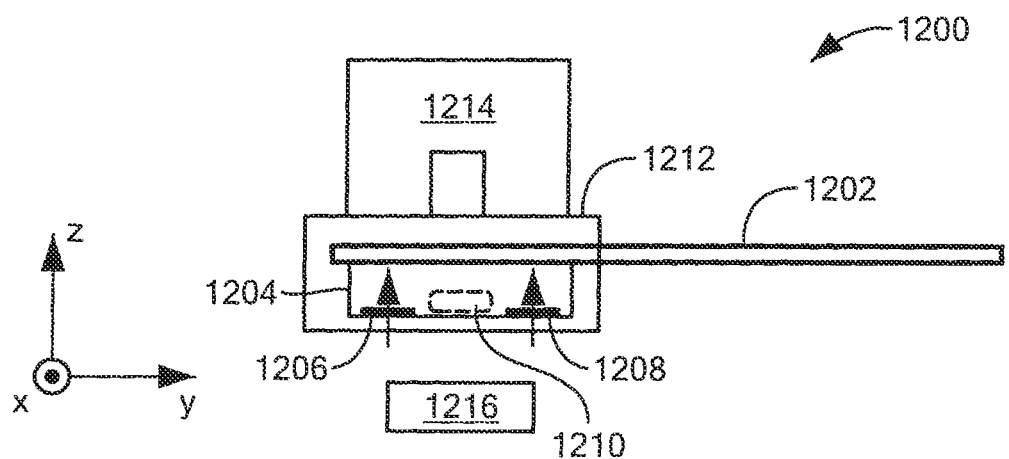
FIG. 12 is a block diagram of another current sensor having two planar Hall elements and an electronic circuit disposed on or within a substrate, the substrate disposed upon a first surface of a lead frame, an enclosure surrounding the substrate and a portion of the lead frame, and a magnetic flux concentrator disposed over the enclosure.

The current sensor 1100 and a current sensor show below in conjunction with FIG. 12 are shown to have single in line package (SIP) arrangements. It will be recognized that other package arrangements, e.g., surface mount (SMD) arrangements, are also possible using the similar packaging techniques.

Referring now to FIG. 12, a current sensor 1200 can include first and second planar Hall elements 1206, 1208 disposed over or within a surface of a substrate 1204, for example, a semiconductor substrate. An electronic circuit 1210 can also be disposed over or within the surface of a substrate 1204 The electronic circuit 1210 can be the same as or similar to the electronic circuit 301 of FIG. 3.

The substrate 1204 can be disposed proximate to or upon a lead frame 1202, and electrically coupled to the lead frame with bond wires or the like.

A mold compound 1212 can encapsulate the substrate 1204 and a portion of the lead frame 1202. A magnetic flux concentrator 1214 can be disposed proximate to an opposite side of the lead frame 1202 and over the mold compound 1212. The magnetic flux concentrator 1214 can be coupled to the mold compound 1212 with an adhesive.

The current sensor 1200 can be disposed proximate to a conductor 1216 that can carry a current that is measured by the current sensor 1200. The measured current can be in a direction into or out of the page.

Figure 13:
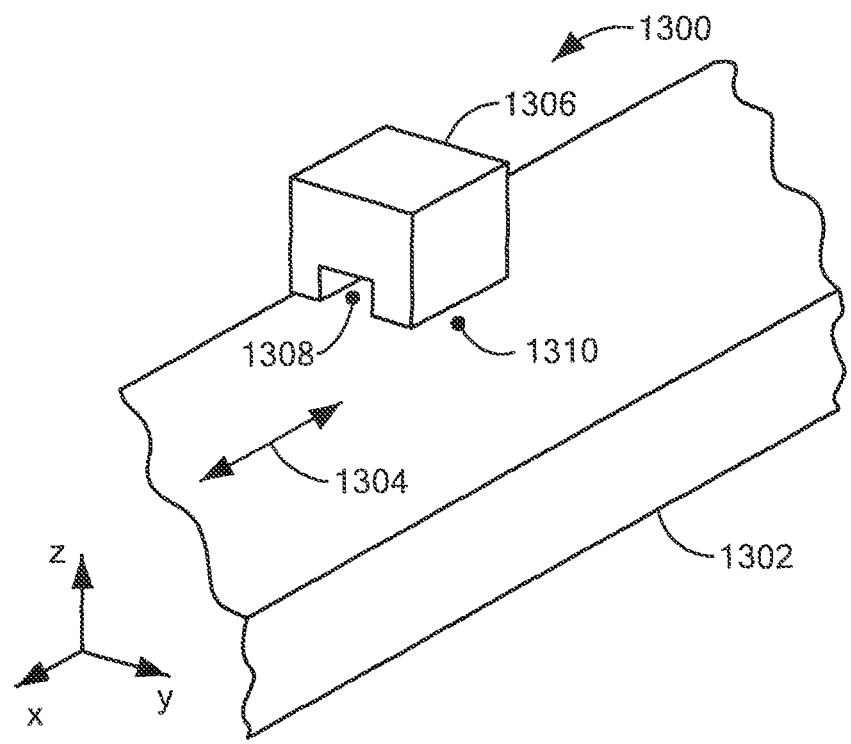
FIG. 13 is a perspective drawing showing a solid magnetic flux concentrator disposed proximate to positions of two planar Hall elements, the magnetic flux concentrator disposed over a bus bar conductor.

Referring now to FIG. 13, in comparison with FIG. 4, a current sensor arrangement 1300 includes a magnetic flux concentrator 1306 and positions 1308, 1310 of planar Hall elements in relation to a bus bar conductor 1302. An arrow 1304 is indicative of directions of current that can be sensed with the current sensor arrangement 1300.

The magnetic flux concentrator 1306 can be a comprised of a uniform material.

Figure 14:
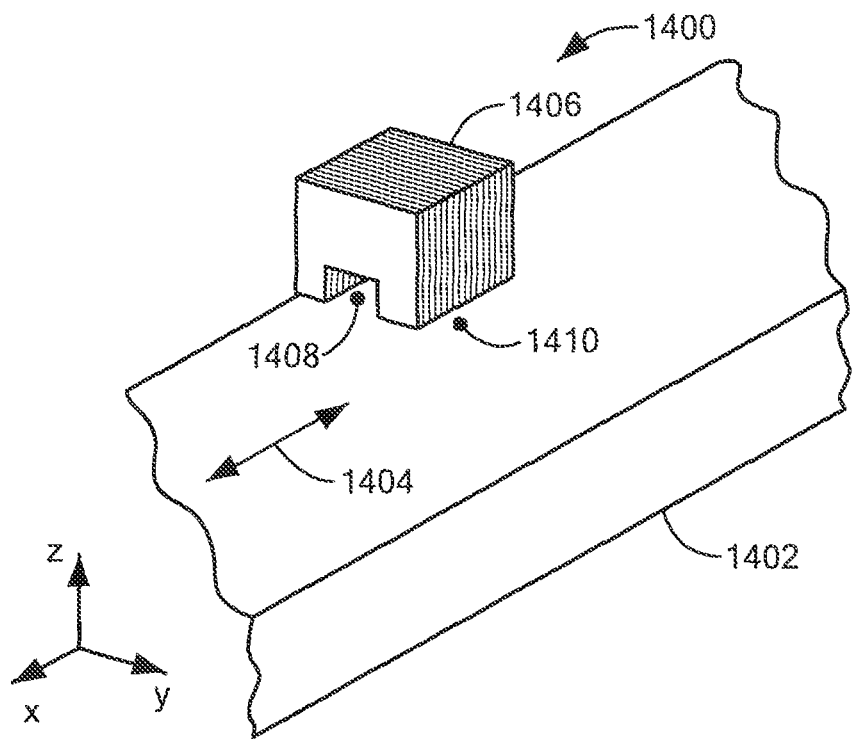
FIG. 14 is a perspective drawing showing a laminated magnetic flux concentrator disposed proximate to positions of two planar Hall elements, the magnetic flux concentrator disposed over a bus bar conductor.

Referring now to FIG. 14, in comparison with FIG. 4, a current sensor arrangement 1400 includes a magnetic flux concentrator 1406 and positions 1408, 1410 of planar Hall elements in relation to a bus bar conductor 1402. An arrow 1404 is indicative of directions of current that can be sensed with the current sensor arrangement 1400.

The magnetic flux concentrator 1406 can be a comprised of a plurality of high permeability layers in order to be less impacted by any eddy currents that may occur within the magnetic flux concentrator 1406 compared with the magnetic flux concentrator 1306 of FIG. 13. As described above, the layers are used to improve the accuracy of the current sensor arrangement 1400 when eddy currents are experienced, i.e. when sufficiently high frequency AC currents flow in bus bar 1302

Layered magnetic flux concentrators can be used in place of any of the magnetic flux concentrators described here.

Figure 15:
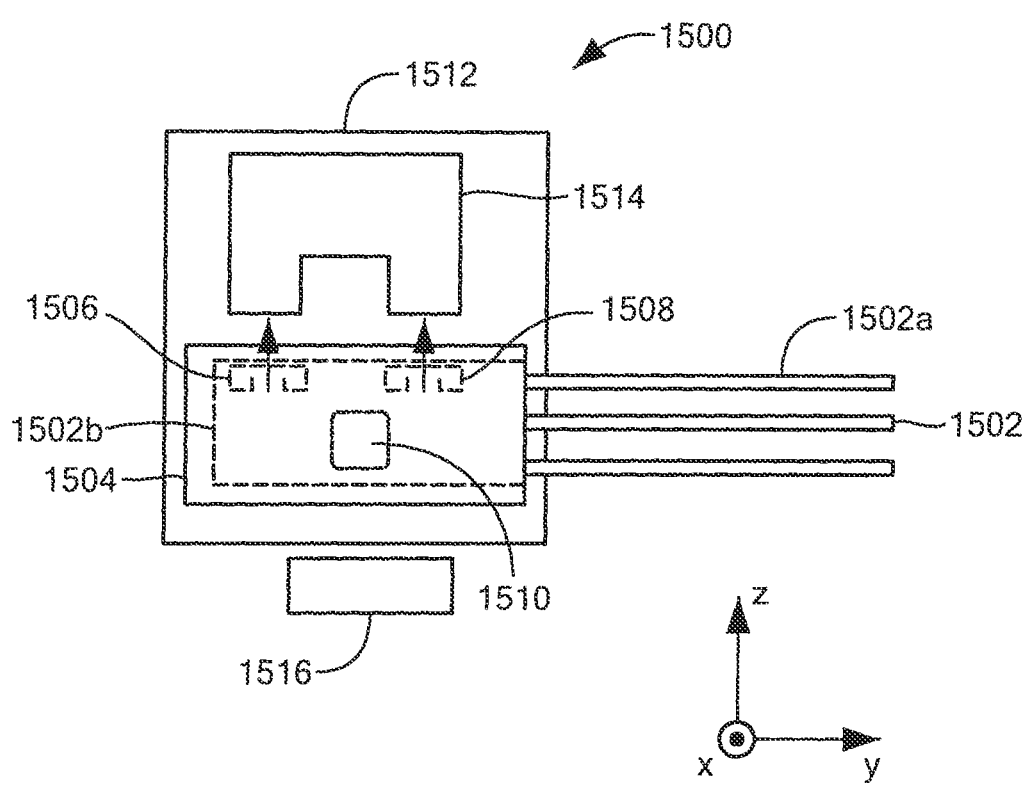
FIG. 15 is a block diagram of another current sensor having two magnetoresistance elements and an electronic circuit disposed on or within a substrate, the substrate disposed upon a first surface of a lead frame, and a magnetic flux concentrator disposed proximate to the substrate.

Referring now to FIG. 15, a current sensor 1500 can include first and second magnetoresistance elements 1506, 1508 disposed over or within a surface of a substrate 1504, for example, a semiconductor substrate. Arrows over the magnetoresistance elements 1506, 1508 are representative of maximum response directions or axes.

An electronic circuit 1510 can also be disposed over or within the surface of a substrate 1504 The electronic circuit 1510 can include a bridge circuit that couples the first and second magnetoresistance elements 1506, 1508 to generate a differential signal.

The substrate 1504 can be disposed proximate to or upon a lead frame 1502, and electrically coupled to the lead frame with bond wires or the like. The lead frame can include leads 1502 and a mounting plate 1502b.

A magnetic flux concentrator 1514 can be disposed proximate to an edge of the substrate 1504. The magnetic flux concentrator 1514 can be like any of the magnetic flux concentrators described above. A mold compound 1512 can encapsulate the substrate 1504, the magnetic flux concentrator 1514, and a portion of the lead frame 1502. An alternate arrangement like the arrangement of FIG. 12 can leave the magnetic flux concentrator 1514 outside of the mold compound.

The current sensor 1500 can be disposed proximate to a conductor 1516 that can carry a current that is measured by the current sensor 1510. The measured current can be in a direction into or out of the page.

Flux lines will be understood from discussion above to pass through the first and second magnetoresistance elements 1506, 1508 with direction components parallel to the arrows that indicate the maximum response directions, but in opposite directions.

All references cited herein are hereby incorporated herein by reference in their entirety.

Having described preferred embodiments, which serve to illustrate various concepts, structures and techniques, which are the subject of this patent, it will now become apparent that other embodiments incorporating these concepts, structures and techniques may be used. Accordingly, it is submitted that the scope of the patent should not be limited to the described embodiments but rather should be limited only by the spirit and scope of the following claims.

Elements of embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. A current sensor for sensing an electrical current flowing in a conductor, comprising:
    a magnetic flux concentrator;
    a first magnetic field sensing element disposed proximate to the magnetic flux concentrator, the first magnetic field sensing element having a first maximum response axis, the first magnetic field sensing element operable to generate a first signal responsive to a first magnetic field proximate to the first magnetic field sensing element resulting from the electrical current passing through the conductor, wherein the magnetic flux concentrator is operable to influence a direction of the first magnetic field;
    a second magnetic field sensing element disposed proximate to the magnetic flux concentrator, the second magnetic field sensing element having a second maximum response axis, the second magnetic field sensing element operable to generate a second signal responsive to a second magnetic field proximate to the second magnetic field sensing element resulting from the electrical current passing through the conductor, wherein the magnetic flux concentrator is operable to influence a direction of the second magnetic field, wherein the first and second magnetic field sensing elements are disposed between the conductor and the entire magnetic flux concentrator, wherein the magnetic flux concentrator comprises a first surface disposed proximate to the first magnetic field sensing element and a second surface disposed proximate to the second magnetic field sensing element, wherein the first surface and the second surface are separated by a channel, and wherein the channel has a channel surface distal from the first and second magnetic field sensing elements; and
    a differencing circuit operable to subtract the first and second signals to generate a difference signal related to the electrical current.

2. The current sensor of claim 1, wherein the magnetic flux concentrator is operable to influence the direction of the first magnetic field to pass through the first magnetic field sensing element in a first direction, and wherein the magnetic flux concentrator is operable to influence the direction of the second magnetic field to pass through the second magnetic field sensing element in a second direction different than the first direction.

3. The current sensor of claim 2, wherein the first magnetic field sensing element comprises a first planar Hall element, and wherein the second magnetic field sensing element comprises a second planar Hall element.

4. The current sensor of claim 3, wherein the first and second maximum response axes are parallel to a common axis.

5. The current sensor of claim 3, wherein the magnetic flux concentrator is operable to influence the direction of the first magnetic field to pass through the first planar Hall element in a first direction, and wherein the magnetic flux concentrator is operable to influence the direction of the second magnetic field to pass through the second planar Hall element in a second direction substantially opposite from the first direction.

6. The current sensor of claim 3, wherein the magnetic flux concentrator is operable to influence the direction of the first magnetic field to pass through the first planar Hall element in a first direction, wherein the magnetic flux concentrator is operable to influence the direction of the second magnetic field to pass through the second planar Hall element in a second direction different than the first direction, and wherein the first and second directions differ by an angle difference in a range of one hundred eighty to one hundred forty degrees.

7. The current sensor of claim 3, wherein the magnetic flux concentrator is operable to influence the direction of the first magnetic field to pass through the first planar Hall element in a first direction, wherein the magnetic flux concentrator is operable to influence the direction of the second magnetic field to pass through the second planar Hall element in a second direction different than the first direction, and wherein the first and second directions differ by an angle difference in a range of two hundred to forty degrees.

8. The current sensor of claim 3, wherein the magnetic flux concentrator has a relative magnetic permeability greater than two.

9. The current sensor of claim 3, wherein the magnetic flux concentrator has a central plane bisecting the magnetic flux concentrator, wherein the magnetic flux concentrator is substantially symmetrical around the central plane, and wherein the first and second planar Hall elements are disposed on opposite sides of the central plane.

10. The current sensor of claim 9, wherein the first and second planar Hall elements are equidistant from the central plane.

11. The current sensor of claim 3, wherein the magnetic flux concentrator has a shape and a position selected to result in the first signal and the second signal being opposite signals having substantially the same amplitude but opposite signs.

12. A method of sensing an electrical current flowing in a conductor, comprising:
    providing a first magnetic field sensing element disposed proximate to a magnetic flux concentrator, the first magnetic field sensing element having a first maximum response axis;
    providing a second magnetic field sensing element disposed proximate to the magnetic flux concentrator, the second magnetic field sensing element having a second maximum response axis;
    using the first magnetic field sensing element to generate a first signal responsive to a first magnetic field proximate resulting from the electrical current passing through the conductor, wherein the magnetic flux concentrator is operable to influence a direction of the first magnetic field;
    using the second magnetic field sensing element to generate a second signal responsive to a second magnetic field resulting from the electrical current passing through the conductor, wherein the magnetic flux concentrator is operable to influence a direction of the second magnetic field, wherein the first and second magnetic field sensing elements are disposed between the conductor and the entire magnetic flux concentrator, wherein the magnetic flux concentrator comprises a first surface disposed proximate to the first magnetic field sensing element and a second surface disposed proximate to the second magnetic field sensing element, wherein the first surface and the second surface are separated by a channel, and wherein the channel has a channel surface distal from the first and second magnetic field sensing elements; and with a differencing circuit, subtracting the first and second signals to generate a difference signal related to the electrical current.

13. The method of claim 12, wherein the magnetic flux concentrator is operable to influence the direction of the first magnetic field to pass through the first magnetic field sensing element in a first direction, and wherein the magnetic flux concentrator is operable to influence the direction of the second magnetic field to pass through the second magnetic field sensing element in a second direction different than the first direction.

14. The method of claim 13, wherein the first magnetic field sensing element comprises a first planar Hall element, and wherein the second magnetic field sensing element comprises a second planar Hall element.

15. The method of claim 14, wherein the first and second maximum response axes are parallel to a common axis.

16. The method of claim 14, wherein the magnetic flux concentrator is operable to influence the direction of the first magnetic field to pass through the first planar Hall element in a first direction, and wherein the magnetic flux concentrator is operable to influence the direction of the second magnetic field to pass through the second planar Hall element in a second direction substantially opposite from the first direction.

17. The method of claim 14, wherein the magnetic flux concentrator is operable to influence the direction of the first magnetic field to pass through the first planar Hall element in a first direction, wherein the magnetic flux concentrator is operable to influence the direction of the second magnetic field to pass through the second planar Hall element in a second direction different than the first direction, and wherein the first and second directions differ by an angle difference in a range of one hundred eighty to one hundred forty degrees.

18. The method of claim 14, wherein the magnetic flux concentrator is operable to influence the direction of the first magnetic field to pass through the first planar Hall element in a first direction, wherein the magnetic flux concentrator is operable to influence the direction of the second magnetic field to pass through the second planar Hall element in a second direction different than the first direction, and wherein the first and second directions differ by an angle difference in a range of two hundred degrees to forty degrees.

19. The method of claim 14, wherein the magnetic flux concentrator has a relative magnetic permeability greater than two.

20. The method of claim 14, wherein the magnetic flux concentrator has a central plane bisecting the magnetic flux concentrator, wherein the magnetic flux concentrator is substantially symmetrical around the central plane, and wherein the first and second planar Hall elements are disposed on opposite sides of the central plane.

21. The method of claim 20, wherein the first and second planar Hall elements are equidistant from the central plane.

22. The method of claim 14, wherein the magnetic flux concentrator has a shape and a position selected to result in the first signal and the second signal being opposite signals having substantially the same amplitude but opposite signs.

23. The current sensor of claim 1, wherein the magnetic flux concentrator has a shape and a position selected to result in the first signal and the second signal having opposite signs.

24. The current sensor of claim 3, wherein the magnetic flux concentrator has a shape and a position selected to result in the first signal and the second signal having opposite signs.

25. The method of claim 12, wherein the magnetic flux concentrator has a shape and a position selected to result in the first signal and the second signal having opposite signs.

26. The method of claim 14, wherein the magnetic flux concentrator has a shape and a position selected to result in the first signal and the second signal having opposite signs.

27. A current sensor for sensing an electrical current flowing in a conductor, comprising:
  a magnetic flux concentrator;
  a first magnetic field sensing element disposed proximate to the magnetic flux concentrator, the first magnetic field sensing element having a first maximum response axis, the first magnetic field sensing element operable to generate a first signal responsive to a first magnetic field proximate to the first magnetic field sensing element resulting from the electrical current passing through the conductor, wherein the magnetic flux concentrator is operable to influence a direction of the first magnetic field;
  a second magnetic field sensing element disposed proximate to the magnetic flux concentrator, the second magnetic field sensing element having a second maximum response axis, the second magnetic field sensing element operable to generate a second signal responsive to a second magnetic field proximate to the second magnetic field sensing element resulting from the electrical current passing through the conductor, wherein the magnetic flux concentrator is operable to influence a direction of the second magnetic field, wherein the first and second magnetic field sensing elements are disposed between the conductor and the entire magnetic flux concentrator; and
  a differencing circuit operable to subtract the first and second signals to generate a difference signal related to the electrical current, wherein the entire magnetic flux concentrator is disposed on one and only one side of a plane, the plane parallel to the direction of the electrical current, the plane intersecting the first and second magnetic field sensing elements, and wherein the conductor is disposed on the other side of the plane.

28. A method of sensing an electrical current flowing in a conductor, comprising:
  providing a first magnetic field sensing element disposed proximate to a magnetic flux concentrator, the first magnetic field sensing element having a first maximum response axis;
  providing a second magnetic field sensing element disposed proximate to the magnetic flux concentrator, the second magnetic field sensing element having a second maximum response axis;
  using the first magnetic field sensing element to generate a first signal responsive to a first magnetic field proximate resulting from the electrical current passing through the conductor, wherein the magnetic flux concentrator is operable to influence a direction of the first magnetic field;

using the second magnetic field sensing element to generate a second signal responsive to a second magnetic field resulting from the electrical current passing through the conductor, wherein the magnetic flux concentrator is operable to influence a direction of the second magnetic field, wherein the first and second magnetic field sensing elements are disposed between the conductor and the entire magnetic flux concentrator; and with a differencing circuit, subtracting the first and second signals to generate a difference signal related to the electrical current, wherein the entire magnetic flux concentrator is disposed on one and only one side of a plane, the plane parallel to the direction of the electrical current, the plane intersecting the first and second magnetic field sensing elements, and wherein the conductor is disposed on the other side of the plane.

29. A current sensor for sensing an electrical current flowing in a conductor, comprising:

a magnetic flux concentrator;

a first magnetic field sensing element disposed proximate to the magnetic flux concentrator, the first magnetic field sensing element having a first maximum response axis, the first magnetic field sensing element operable to generate a first signal responsive to a first magnetic field proximate to the first magnetic field sensing element resulting from the electrical current passing through the conductor, wherein the magnetic flux concentrator is operable to influence a direction of the first magnetic field;

a second magnetic field sensing element disposed proximate to the magnetic flux concentrator, the second magnetic field sensing element having a second maximum response axis, the second magnetic field sensing element operable to generate a second signal responsive to a second magnetic field proximate to the second magnetic field sensing element resulting from the electrical current passing through the conductor, wherein the magnetic flux concentrator is operable to influence a direction of the second magnetic field, wherein the first and second magnetic field sensing elements are disposed between the conductor and the entire magnetic flux concentrator; and a differencing circuit operable to subtract the first and second signals to generate a difference signal related to the electrical current, wherein the magnetic flux concentrator is comprised of a laminated structure having a plurality of layers.

30. A method of sensing an electrical current flowing in a conductor, comprising:

providing a first magnetic field sensing element disposed proximate to a magnetic flux concentrator, the first magnetic field sensing element having a first maximum response axis;

providing a second magnetic field sensing element disposed proximate to the magnetic flux concentrator, the second magnetic field sensing element having a second maximum response axis;

using the first magnetic field sensing element to generate a first signal responsive to a first magnetic field proximate resulting from the electrical current passing through the conductor, wherein the magnetic flux concentrator is operable to influence a direction of the first magnetic field;

using the second magnetic field sensing element to generate a second signal responsive to a second magnetic field resulting from the electrical current passing through the conductor, wherein the magnetic flux concentrator is operable to influence a direction of the second magnetic field, wherein the first and second magnetic field sensing elements are disposed between the conductor and the entire magnetic flux concentrator; and with a differencing circuit, subtracting the first and second signals to generate a difference signal related to the electrical current, wherein the magnetic flux concentrator is comprised of a laminated structure having a plurality of layers.

31. The current sensor of claim 27, wherein the magnetic flux concentrator is operable to influence the direction of the first magnetic field to pass through the first magnetic field sensing element in a first direction, and wherein the magnetic flux concentrator is operable to influence the direction of the second magnetic field to pass through the second magnetic field sensing element in a second direction different than the first direction.

32. The current sensor of claim 31, wherein the first magnetic field sensing element comprises a first planar Hall element, and wherein the second magnetic field sensing element comprises a second planar Hall element.

33. The current sensor of claim 32, wherein the magnetic flux concentrator is operable to influence the direction of the first magnetic field to pass through the first planar Hall element in a first direction, and wherein the magnetic flux concentrator is operable to influence the direction of the second magnetic field to pass through the second planar Hall element in a second direction substantially opposite from the first direction.

34. The current sensor of claim 32, wherein the magnetic flux concentrator is operable to influence the direction of the first magnetic field to pass through the first planar Hall element in a first direction, wherein the magnetic flux concentrator is operable to influence the direction of the second magnetic field to pass through the second planar Hall element in a second direction different than the first direction, and wherein the first and second directions differ by an angle difference in a range of one hundred eighty to one hundred forty degrees.

35. The current sensor of claim 32, wherein the magnetic flux concentrator is operable to influence the direction of the first magnetic field to pass through the first planar Hall element in a first direction, wherein the magnetic flux concentrator is operable to influence the direction of the second magnetic field to pass through the second planar Hall element in a second direction different than the first direction, and wherein the first and second directions differ by an angle difference in a range of two hundred to forty degrees.

36. The current sensor of claim 32, wherein the magnetic flux concentrator has a central plane bisecting the magnetic flux concentrator, wherein the magnetic flux concentrator is substantially symmetrical around the central plane, and wherein the first and second planar Hall elements are disposed on opposite sides of the central plane.

37. The method of claim 28, wherein the magnetic flux concentrator is operable to influence the direction of the first magnetic field to pass through the first magnetic field sensing element in a first direction, and wherein the magnetic flux concentrator is operable to influence the direction of the second magnetic field to pass through the second magnetic field sensing element in a second direction different than the first direction.

38. The method of claim 37, wherein the first magnetic field sensing element comprises a first planar Hall element, and wherein the second magnetic field sensing element comprises a second planar Hall element.

39. The method of claim 38, wherein the magnetic flux concentrator is operable to influence the direction of the first magnetic field to pass through the first planar Hall element in a first direction, and wherein the magnetic flux concentrator is operable to influence the direction of the second magnetic field to pass through the second planar Hall element in a second direction substantially opposite from the first direction.

40. The method of claim 38, wherein the magnetic flux concentrator is operable to influence the direction of the first magnetic field to pass through the first planar Hall element in a first direction, wherein the magnetic flux concentrator is operable to influence the direction of the second magnetic field to pass through the second planar Hall element in a second direction different than the first direction, and wherein the first and second directions differ by an angle difference in a range of one hundred eighty to one hundred forty degrees.

41. The method of claim 38, wherein the magnetic flux concentrator is operable to influence the direction of the first magnetic field to pass through the first planar Hall element in a first direction, wherein the magnetic flux concentrator is operable to influence the direction of the second magnetic field to pass through the second planar Hall element in a second direction different than the first direction, and wherein the first and second directions differ by an angle difference in a range of two hundred to forty degrees.

42. The method of claim 38, wherein the magnetic flux concentrator has a central plane bisecting the magnetic flux concentrator, wherein the magnetic flux concentrator is substantially symmetrical around the central plane, and wherein the first and second planar Hall elements are disposed on opposite sides of the central plane.

43. The current sensor of claim 29, wherein the magnetic flux concentrator is operable to influence the direction of the first magnetic field to pass through the first magnetic field sensing element in a first direction, and wherein the magnetic flux concentrator is operable to influence the direction of the second magnetic field to pass through the second magnetic field sensing element in a second direction different than the first direction.

44. The current sensor of claim 43, wherein the first magnetic field sensing element comprises a first planar Hall element, and wherein the second magnetic field sensing element comprises a second planar Hall element.

45. The current sensor of claim 44, wherein the magnetic flux concentrator is operable to influence the direction of the first magnetic field to pass through the first planar Hall element in a first direction, and wherein the magnetic flux concentrator is operable to influence the direction of the second magnetic field to pass through the second planar Hall element in a second direction substantially opposite from the first direction.

46. The current sensor of claim 44, wherein the magnetic flux concentrator is operable to influence the direction of the first magnetic field to pass through the first planar Hall element in a first direction, wherein the magnetic flux concentrator is operable to influence the direction of the second magnetic field to pass through the second planar Hall element in a second direction different than the first direction, and wherein the first and second directions differ by an angle difference in a range of one hundred eighty to one hundred forty degrees.

47. The current sensor of claim 44, wherein the magnetic flux concentrator is operable to influence the direction of the first magnetic field to pass through the first planar Hall element in a first direction, wherein the magnetic flux concentrator is operable to influence the direction of the second magnetic field to pass through the second planar Hall element in a second direction different than the first direction, and wherein the first and second directions differ by an angle difference in a range of two hundred to forty degrees.

48. The current sensor of claim 44, wherein the magnetic flux concentrator has a central plane bisecting the magnetic flux concentrator, wherein the magnetic flux concentrator is substantially symmetrical around the central plane, and wherein the first and second planar Hall elements are disposed on opposite sides of the central plane.

49. The method of claim 30, wherein the magnetic flux concentrator is operable to influence the direction of the first magnetic field to pass through the first magnetic field sensing element in a first direction, and wherein the magnetic flux concentrator is operable to influence the direction of the second magnetic field to pass through the second magnetic field sensing element in a second direction different than the first direction.

50. The method of claim 49, wherein the first magnetic field sensing element comprises a first planar Hall element, and wherein the second magnetic field sensing element comprises a second planar Hall element.

51. The method of claim 50, wherein the magnetic flux concentrator is operable to influence the direction of the first magnetic field to pass through the first planar Hall element in a first direction, and wherein the magnetic flux concentrator is operable to influence the direction of the second magnetic field to pass through the second planar Hall element in a second direction substantially opposite from the first direction.

52. The method of claim 50, wherein the magnetic flux concentrator is operable to influence the direction of the first magnetic field to pass through the first planar Hall element in a first direction, wherein the magnetic flux concentrator is operable to influence the direction of the second magnetic field to pass through the second planar Hall element in a second direction different than the first direction, and wherein the first and second directions differ by an angle difference in a range of one hundred eighty to one hundred forty degrees.

53. The method of claim 50, wherein the magnetic flux concentrator is operable to influence the direction of the first magnetic field to pass through the first planar Hall element in a first direction, wherein the magnetic flux concentrator is operable to influence the direction of the second magnetic field to pass through the second planar Hall element in a second direction different than the first direction, and wherein the first and second directions differ by an angle difference in a range of two hundred to forty degrees.

54. The method of claim 50, wherein the magnetic flux concentrator has a central plane bisecting the magnetic flux concentrator, wherein the magnetic flux concentrator is substantially symmetrical around the central plane, and wherein the first and second planar Hall elements are disposed on opposite sides of the central plane.

* * * * *

UNITED STATES PATENT AND TRADEMARK OFFICE
CERTIFICATE OF CORRECTION

PATENT NO. : 11,099,217 B2
APPLICATION NO. : 16/385111
DATED : August 24, 2021
INVENTOR(S) : Yannick Vuillermet et al.

It is certified that error appears in the above-identified patent and that said Letters Patent is hereby corrected as shown below:

In the Specification

Column 3, Line 48 delete "conductor; and" and replace with --conductor;--.

Column 3, Line 52 delete "conductor; and" and replace with --conductor;--.

Column 10, Lines 50-51 delete "parallel to and y-axis" and replace with --parallel to a y-axis--.

Column 11, Line 32 delete "1104 The" and replace with --1104. The--.

Column 11, Line 48 delete "show below" and replace with --shown below--.

Column 11, Line 59 delete "1104 The" and replace with --1104. The--.

Column 12, Line 39 delete "1504 The" and replace with --1504. The--.

Signed and Sealed this
Eleventh Day of July, 2023

Katherine Kelly Vidal
*Director of the United States Patent and Trademark Office*